(12) United States Patent
Kumazawa et al.

(10) Patent No.: US 8,623,236 B2
(45) Date of Patent: Jan. 7, 2014

(54) TITANIUM NITRIDE-STRIPPING LIQUID, AND METHOD FOR STRIPPING TITANIUM NITRIDE COATING FILM

(75) Inventors: Akira Kumazawa, Kanagawa (JP); Takahiro Eto, Kanagawa (JP); Takayuki Haraguchi, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 1075 days.

(21) Appl. No.: 12/171,198

(22) Filed: Jul. 10, 2008

(65) Prior Publication Data
US 2009/0017636 A1 Jan. 15, 2009

(30) Foreign Application Priority Data

| Jul. 13, 2007 | (JP) | 2007-184692 |
| Jul. 13, 2007 | (JP) | 2007-184693 |
| Jul. 13, 2007 | (JP) | 2007-184694 |
| Jun. 2, 2008 | (JP) | 2008-144933 |

(51) Int. Cl.
C09K 13/00 (2006.01)
C03C 25/68 (2006.01)

(52) U.S. Cl.
USPC ........ 252/79.1; 252/79.2; 252/79.3; 216/100; 216/104; 216/107; 216/108; 216/109

(58) Field of Classification Search
USPC ............... 252/79.1, 79.2, 79.3; 216/100, 104, 216/107, 108, 109
See application file for complete search history.

(56) References Cited

U.S. PATENT DOCUMENTS

| 4,220,706 A * | 9/1980 | Spak ........................ 430/318 |
| 5,456,767 A * | 10/1995 | Shah et al. ................ 148/251 |
| 6,858,097 B2 * | 2/2005 | Giordani et al. .......... 148/242 |
| 2004/0204329 A1 * | 10/2004 | Abe et al. ................. 510/175 |
| 2005/0176604 A1 * | 8/2005 | Lee et al. ................. 510/175 |
| 2005/0261151 A1 * | 11/2005 | Lee et al. ................. 510/175 |
| 2006/0014391 A1 * | 1/2006 | Lee et al. ................. 438/695 |
| 2009/0215658 A1 * | 8/2009 | Minsek et al. ............ 510/175 |

FOREIGN PATENT DOCUMENTS

| JP | H01-272785 | 10/1989 |
| JP | 10-050986 | 2/1998 |
| JP | 11269676 A * | 10/1999 |
| JP | 2000-031114 | 1/2000 |
| JP | 2009-021516 | 1/2001 |
| JP | 2001-077118 | 3/2001 |
| JP | 2002146562 | 5/2002 |
| JP | 2003-234307 | 8/2003 |
| JP | 2004-317640 | 11/2004 |
| JP | 2004-043850 | 12/2004 |
| JP | 2005-097715 | 4/2005 |
| JP | 2005-333104 | 12/2005 |
| JP | 2006-058675 | 3/2006 |
| JP | 2006-060078 | 3/2006 |
| JP | 2007-116077 | 5/2007 |
| JP | 2007-150118 | 6/2007 |
| JP | 2007-005656 | 11/2007 |
| JP | 2009-019255 | 1/2009 |
| JP | 2009-044129 | 2/2009 |
| WO | 2004-111157 A1 | 12/2004 |

OTHER PUBLICATIONS

Wikipedia, The Free Encyclopedia, "Pyridine", http://en.wikipedia.org/wiki/Pyridine ; pp. 1-21, 2012.*
Wikipedia, The Free Encyclopedia, "Quinoline" http://en.wikipedia.org/wiki/Quinoline ; pp. 1-3; 2012.*
Wikipedia, The Free Encyclopedia, "Methylamine" http://en.wikipedia.org/wiki/Methylamine ; pp. 1-4, 2012.*
Wikipedia, The Free Encyclopedia, "Benzyl mercaptan", http://en.wikipedia.org/wiki/Benzyl_mercaptan ; pp. 1-2, 2012.*
Wikipedia, The Free Encyclopedia, "Glutamic acid", http://en.wikipedia.org/wiki/Glutamic_acid , pp. 1-7 2012.*
LennTech "Disinfectants Peracetic acid" http://www.lenntech.com/processes/disinfection/chemical/disinfectants-peracetic-acid.htm ; pp. 1-2, 2011.*
Notice of Reasons for Rejection issued to JP Application No. 2007-184693, mailed Nov. 8, 2011.
Notice of Reasons for Rejection issued to JP Application No. 2008-144933, mailed Apr. 17, 2012, 2 pages.
Decision to Grant issued to JP Application No. 2007-184693, mailed Jun. 26, 2012.
Decision to Grant issued to JP Application No. 2008-144933, mailed Jun. 26, 2012.
Notice of Reasons for Rejection issued to JP Application No. 2007-184694, mailed Oct. 2, 2012.

* cited by examiner

*Primary Examiner* — Binh X Tran
(74) *Attorney, Agent, or Firm* — Procopio Cory Hargreaves & Savitch LLP

(57) ABSTRACT

A titanium nitride-stripping liquid for stripping a titanium nitride coating film, the titanium nitride-stripping liquid being capable of stripping a titanium nitride coating film even in a semiconductor multilayer laminate having particularly a layer that includes tungsten or a tungsten alloy, without corrosion of this layer is provided, and furthermore, a titanium nitride-stripping liquid which can strip a titanium nitride coating film without affecting an insulating layer is provided. A titanium nitride-stripping liquid including hydrofluoric acid, hydrogen peroxide and water, and further including an inorganic acid other than hydrofluoric acid. According to the present invention, since the titanium nitride-stripping liquid includes an inorganic acid other than hydrofluoric acid, a titanium nitride coating film can be stripped even in the case in which a semiconductor multilayer laminate has a layer that includes tungsten or a tungsten alloy, without corrosion of the layer by the titanium nitride-stripping liquid.

23 Claims, No Drawings

TITANIUM NITRIDE-STRIPPING LIQUID, AND METHOD FOR STRIPPING TITANIUM NITRIDE COATING FILM

CROSS REFERENCE TO RELATED APPLICATION

This application is based on and claims the benefit of priority from Japanese Patent Application Nos. 2007-184694, 2007-184693, 2007-184692 that were each filed on 13 Jul. 2007 and Japanese Patent Application No. 2008-144933 filed on 2 Jun. 2008, the content of each which is incorporated herein by reference in its entirety.

BACKGROUND OF THE INVENTION

1. Field of the Invention

The present invention relates to a titanium nitride-stripping liquid, and a method for stripping a titanium nitride coating film.

2. Related Art

Conventionally, etching processing in manufacture of semiconductor devices and the like generally includes: coating a resist material such as a photoresist or an electron beam resist on the surface of a substrate to be etched; carrying out etching using as an etching mask the resist film formed to have a pattern by a lithography technology; stripping the resist film after the etching; and thereby forming a specified pattern on the etched substrate. According to such a process, in etching with the resist film as an etching mask, there may be a case in which the resist film does not sufficiently serve as the etching mask, depending on the etching rate of the used substrate to be etched due to the problems of etching selectivity of the resist film for the substrate to be etched.

Therefore, when a substrate to be etched which may have lowered etching selectivity is etched using a resist film as an etching mask, high etching selectivity of the etching mask for the substrate to be etched is maintained by providing an etching mask referred to as a hard mask constituted with a titanium coating film, a titanium nitride coating film or the like. A stripping liquid of an etching mask has been desired, which can remove the etching mask constituted with titanium or titanium nitride after etching the substrate to be etched without causing damage on a conductor layer or an insulating layer, in the case of use of the hard mask as an etching mask.

Known other technologies in which a titanium nitride coating film is used include, for example, techniques for producing a transistor having a hybrid gate structure. In p type transistors having a hybrid gate structure, a structure is formed in which a titanium nitride coating film is laminated on a high-permittivity film. As an etching liquid that is a titanium nitride-stripping liquid used in pattern formation of this titanium nitride coating film, an etching liquid has been desired which does not affect characteristics of the high-permittivity film.

As a liquid for dissolving the titanium thin film, Japanese Unexamined Patent Application Publication No. 2002-146562 discloses an etching agent of titanium which includes an aqueous solution containing hydrofluoric acid and hydrogen peroxide. According to the etching agent of titanium disclosed in Japanese Unexamined Patent Application Publication No. 2002-146562, fine pattern formation of a titanium thin film is reportedly enabled without corrosion of the resist, and with less influences on the substrate material such as aluminum or an alloy thereof, $SiO_2$, or Si.

SUMMARY OF THE INVENTION

Although the etching agent disclosed in Japanese Unexamined Patent Application Publication No. 2002-146562 can be used also as a liquid for stripping a titanium nitride coating film, when a titanium nitride coating film as a hard mask is removed using the etching agent of titanium disclosed in Japanese Unexamined Patent Application Publication No. 2002-146562, change in electrical characteristics and the like could be caused through corrosion of the conductor layer, depending on the metal material used for the conductor layer in the semiconductor multilayer laminate. In particular, when a layer that includes tungsten or a tungsten alloy is used in the semiconductor multilayer laminate, this layer could be corroded by the etching agent.

In addition, when the etching agent disclosed in Japanese Unexamined Patent Application Publication No. 2002-146562 is used as the liquid for stripping a titanium nitride coating film, the anticorrosive effect on the insulating film by the etching agent is not necessarily sufficient, and electrical properties of the insulating layer may be affected depending on the condition employed in stripping the titanium nitride coating film.

The present invention was made in view of the aforementioned problems, and an object of the present invention is to provide a titanium nitride-stripping liquid for stripping a titanium nitride coating film, the titanium nitride-stripping liquid being capable of stripping a titanium nitride coating film, particularly even in a semiconductor multilayer laminate having a layer that includes tungsten or a tungsten alloy, without corrosion of this layer, and further to provide a titanium nitride-stripping liquid which can strip a titanium nitride coating film without affecting an insulating layer.

The present inventors found that a titanium nitride coating film can be stripped when a titanium nitride-stripping liquid contains hydrofluoric acid, hydrogen peroxide and water, and further contains an inorganic acid other than hydrofluoric acid, even though it is applied to a semiconductor multilayer laminate in which a layer that includes tungsten or a tungsten alloy is formed, without causing damage on the layer, thereby achieving the completion of the present invention.

Specifically, the present invention provides the following.

In a first aspect of the present invention, there is provided a titanium nitride-stripping liquid including hydrofluoric acid, hydrogen peroxide and water, and further including an inorganic acid other than hydrofluoric acid.

In a second aspect of the present invention, there is provided a titanium nitride-stripping liquid including hydrofluoric acid, hydrogen peroxide, a water-soluble organic solvent, and an anticorrosive, in which the anticorrosive is a nitrogen-containing five-membered ring compound having two nitrogen atoms in the ring.

In a third aspect of the present invention, there is provided a titanium nitride-stripping liquid including hydrofluoric acid, hydrogen peroxide, and a water-soluble organic solvent, in which the water-soluble organic solvent includes a polyhydric alcohol or an alkyl ether thereof.

Moreover, in a fourth aspect of the present invention, there is provided a method for removing a titanium nitride coating film which includes bringing a semiconductor multilayer laminate having a layer that includes tungsten or a tungsten alloy, and a titanium nitride coating film to be in contact with the titanium nitride-stripping liquid of the present invention, whereby the titanium nitride coating film is dissolved and removed.

According to the first aspect of the present invention, since the titanium nitride-stripping liquid includes an inorganic acid other than hydrofluoric acid, a titanium nitride coating film can be stripped even in the case in which the semiconductor multilayer laminate has a layer that includes tungsten or a tungsten alloy, without corrosion of the layer by the titanium nitride-stripping liquid.

Moreover, according to the second aspect of the present invention, since the titanium nitride-stripping liquid includes a nitrogen-containing compound having two nitrogen atoms in the ring, a titanium nitride coating film can be stripped even in the case in which the semiconductor multilayer laminate has a layer that includes tungsten or a tungsten alloy, without corrosion of the layer by the titanium nitride-stripping liquid.

Furthermore, according to the third aspect of the present invention, since the titanium nitride-stripping liquid contains a polyhydric alcohol or an alkyl ether thereof, the corrosion of the insulating layer by the titanium nitride-stripping liquid can be inhibited when the titanium nitride coating film is stripped.

DETAILED DESCRIPTION OF THE INVENTION

Hereinafter, embodiments of the present invention will be explained in detail.

First Embodiment

The first embodiment of the present invention is described below.
Titanium Nitride-Stripping Liquid The titanium nitride-stripping liquid of the present invention includes hydrofluoric acid, hydrogen peroxide, water, and an inorganic acid other than hydrofluoric acid. Furthermore, the titanium nitride-stripping liquid of the present invention may also include an anticorrosive, and a water-soluble organic solvent such as a glycol ether as needed. This titanium nitride-stripping liquid can be particularly suitably used when a titanium nitride coating film is stripped in a semiconductor multilayer laminate having a titanium nitride coating film, a conductor layer, and an insulating layer.
Hydrofluoric Acid The titanium nitride-stripping liquid of the present invention includes hydrofluoric acid. Since the titanium nitride-stripping liquid includes hydrofluoric acid, the titanium nitride coating film can be efficiently stripped. The content of hydrofluoric acid which can be included in the titanium nitride-stripping liquid is preferably no less than 0.01% by mass and no greater than 5% by mass. The content of hydrofluoric acid falling within the above range serves in keeping high solubility of titanium nitride in the titanium nitride-stripping liquid, and can inhibit corrosion of the conductor layer and the insulating layer. The content is more preferably no less than 0.1% by mass and no greater than 2% by mass.
Hydrogen Peroxide The titanium nitride-stripping liquid of the present invention includes hydrogen peroxide. Since the titanium nitride-stripping liquid includes hydrogen peroxide, dissolution of titanium nitride in the titanium nitride-stripping liquid is accelerated, and the corrosion of the conductor layer and the insulating layer by hydrofluoric acid can be inhibited. Furthermore, hydrogen peroxide can capture the hydrogen gas generated in the step of dissolving the titanium nitride coating film any time, whereby local inhibition of dissolution of titanium nitride by the hydrogen gas may be avoided.

The content of hydrogen peroxide which can be included in the titanium nitride-stripping liquid is preferably no less than 0.1% by mass and no greater than 20% by mass. The content of hydrogen peroxide being no less than 0.1% by mass allows high solubility of titanium nitride in the titanium nitride-stripping liquid to be kept. In addition, when the content of hydrogen peroxide is no greater than 20% by mass, the corrosion of the insulating layer and the conductor layer by excess hydrogen peroxide may be avoided. The content is more preferably no less than 1% by mass and no greater than 10% by mass.
Inorganic Acid The titanium nitride-stripping liquid of the present invention further includes an inorganic acid. The inorganic acid included in the titanium nitride-stripping liquid enables the pH of the titanium nitride-stripping liquid to be lowered. When a layer that includes a metal material that is insoluble in acid such as tungsten or a tungsten alloy is provided in a semiconductor multilayer laminate, the corrosion of the layer that includes tungsten or the tungsten alloy by the titanium nitride-stripping liquid can be further reduced by lowering the pH of the titanium nitride-stripping liquid.

The inorganic acid which can be included in titanium nitride-stripping liquid is not particularly limited as long as it is an inorganic acid other than hydrofluoric acid, and examples thereof include nitric acid, sulfuric acid, hydrochloric acid and the like. These inorganic acids can be preferably used since various types of materials in the semiconductor multilayer laminates are less affected. The inorganic acid is preferably sulfuric acid.

The content of the inorganic acid in the titanium nitride-stripping liquid is preferably no less than 0.1% by mass and no greater than 10% by mass. When the content of the inorganic acid is no less than 0.1% by mass, the corrosion of particularly a layer that includes tungsten, a tungsten alloy or the like by the titanium nitride-stripping liquid can be effectively inhibited. Also, when the content of the inorganic acid is no greater than 10% by mass, decrease of the solubility of titanium nitride may be avoided. The content is more preferably no less than 0.5% by mass and no greater than 5% by mass.

When the inorganic acid is included in the titanium nitride-stripping liquid of the present invention, it is preferred that 100 ml of the titanium nitride-stripping liquid regulated to have a temperature of 25° C. has a pH of no higher than 3 as measured for 1 min with a pH meter calibrated with standard solutions of pH 4 and pH 7. When the pH of the titanium nitride-stripping liquid is adjusted as described above, the corrosion of particularly a layer that includes tungsten, a tungsten alloy or the like in a semiconductor multilayer laminate by the titanium nitride-stripping liquid can be effectively inhibited.

The titanium nitride-stripping liquid of the present invention includes water. The content of water is preferably no less than 10% by mass and no greater than 98% by mass of total solvent in the titanium nitride-stripping liquid. When the content of water is no less than 10% by mass, the effect of the inorganic acid as an acid can be sufficiently exhibited.
Anticorrosive The titanium nitride-stripping liquid of the present invention may include an anticorrosive. Although this anticorrosive is not particularly limited, a nitrogen-containing five-membered ring compound having two nitrogen atoms in the ring can be preferably used when employed for a semiconductor multilayer laminate having a layer that includes tungsten, a tungsten alloy or the like.

Nitrogen-containing five-membered ring compound having two nitrogen atoms in the ring.

When the nitrogen-containing five-membered ring compound having two nitrogen atoms in the ring is used in the titanium nitride-stripping liquid, the corrosion of particularly a layer that includes tungsten, a tungsten alloy or the like by the titanium nitride-stripping liquid can be effectively inhibited.

The nitrogen-containing five-membered ring compound having two nitrogen atoms in the ring is not particularly limited, and conventionally known imidazole and pyrazole, and derivatives thereof can be exemplified. Specific examples include imidazole, 2-methylimidazole, 1,2-methylimidazole, N-methylimidazole, 4-methylimidazole, 2-ethylimidazole, 2-ethyl-4-methylimidazole, vinylimidazole, 2-undecylimidazole, 2-heptadecylimidazole, 2-phenyl-4-methylimidazole, 1-benzyl-2-methylimidazole, pyrazole, and aminopyrazole. Among the nitrogen-containing five-membered ring compounds described above, 2-ethyl-4-methylimidazole, vinylimidazole, and aminopyrazole are preferred. These nitrogen-containing five-membered ring compounds may be used alone, or two or more may be used as a mixture.

The content of the nitrogen-containing five-membered ring compound in the titanium nitride-stripping liquid is preferably no less than 0.1% by mass and no greater than 10% by mass. When the content of the nitrogen-containing five-membered ring compound is no less than 0.1% by mass, the corrosion of particularly a layer that includes tungsten, a tungsten alloy or the like by the titanium nitride-stripping liquid can be effectively inhibited. In addition, when the content of the nitrogen-containing five-membered ring compound is no greater than 10% by mass, decrease of the solubility of titanium nitride may be avoided. The content is more preferably no less than 0.3% by mass and no greater than 5% by mass, and particularly preferably no less than 0.5% by mass and no greater than 2% by mass. Since the nitrogen-containing compound is not soluble in water, an appropriate water-soluble organic solvent is preferably added for permitting dissolution of the nitrogen-containing compound in the titanium nitride-stripping liquid.

Water-Soluble Organic Solvent

The titanium nitride-stripping liquid of the present invention may contain a water-soluble organic solvent. The water-soluble organic solvent which can be included in the titanium nitride-stripping liquid is not particularly limited, and for example, alcohols and glycol ethers may be exemplified.

The content of the water-soluble organic solvent in the titanium nitride-stripping liquid of the present invention is preferably no less than 10% by mass and no greater than 90% by mass. The content of the water-soluble organic solvent being no less than 10% by mass allows the nitrogen-containing five-membered ring compound to be sufficiently dissolved. In addition, when the content of the water-soluble organic solvent is no greater than 90% by mass, decrease of the solubility of titanium nitride may be avoided. The content is more preferably no less than 50% by mass and no greater than 90% by mass, and particularly preferably no less than 70% by mass and no greater than 85% by mass.

Glycol Ether

The titanium nitride-stripping liquid of the present invention preferably contains a glycol ether. By including the glycol ether, the nitrogen-containing five-membered ring compound can be sufficiently dissolved in the titanium nitride-stripping liquid. Moreover, since the glycol ether also involves an action of inhibiting corrosion of the insulating layer, the insulating layer can be inhibited from the corrosion by the titanium nitride-stripping liquid in stripping the titanium nitride coating film.

Although the glycol ether is not particularly limited, for example, the glycol ether represented by the following general formula (1) can be exemplified.

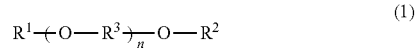

$$R^1 \!-\! (O \!-\! R^3)_n \!-\! O \!-\! R^2 \qquad (1)$$

in the general formula (1), $R^1$ and $R^2$ each independently represent a hydrogen atom, or an alkyl group having 1 to 5 carbon atoms; $R^3$ represents a linear or branched alkylene chain having 1 to 4 carbon atoms; and n is an integer of 1 to 6.

Herein, $R^1$ and $R^2$ each independently represent preferably an alkyl group having 1 to 5 carbon atoms, and more preferably an alkyl group having 1 to 3 carbon atoms. When $R^1$ and $R^2$ are both an alkyl group, the insulating layer can be more effectively inhibited from the corrosion by the titanium nitride-stripping liquid.

Additionally, in light of capability of keeping a high water solubility of the glycol ether, $R^3$ is preferably an ethylene chain or a propylene chain.

Specific examples of the glycol ether which can be included in the titanium nitride-stripping liquid of the present invention include diethylene glycol monomethyl ether, diethylene glycol monoethyl ether, diethylene glycol monobutyl ether, diethylene glycol dimethyl ether, diethylene glycol diethyl ether, diethylene glycol methylethyl ether, triethylene glycol monomethyl ether, tetraethylene glycol monomethyl ether, triethylene glycol dimethyl ether, and tetraethylene glycol dimethyl ether, but not particularly limited thereto. Among these, diethylene glycol monomethyl ether, diethylene glycol monoethyl ether, diethylene glycol dimethyl ether, triethylene glycol dimethyl ether, and tetraethylene glycol dimethyl ether are preferred. These glycol ethers may be used alone, or two or more may be used as a mixture.

The content of the glycol ether in the titanium nitride-stripping liquid of the present invention is preferably no less than 10% by mass and no greater than 90% by mass. The content of the glycol ether being no less than 10% by mass allows the nitrogen-containing five-membered ring compound to be sufficiently dissolved in the titanium nitride-stripping liquid, and can effectively inhibit the corrosion of the insulating layer by the titanium nitride-stripping liquid. In addition, the content of the glycol ether being no greater than 90% by mass allows high solubility of titanium nitride in the titanium nitride-stripping liquid to be kept. The content is more preferably no less than 50% by mass and no greater than 90% by mass, and particularly preferably no less than 70% by mass and no greater than 85% by mass.

Method for Stripping Titanium Nitride Coating Film

In the method for stripping a titanium nitride coating film of the present invention, a semiconductor multilayer laminate having a layer that includes tungsten or a tungsten alloy, a silicon oxide coating film as an insulating layer, and a titanium nitride coating film is brought into contact with the titanium nitride-stripping liquid of the present invention, whereby the titanium nitride coating film is stripped and removed.

Particularly, the method for stripping a titanium nitride coating film of the present invention can be suitably used, in a semiconductor multilayer laminate having a layer that includes tungsten or a tungsten alloy, and a silicon oxide coating film as an insulating layer, when, after a substrate to be etched is etched using a patterned titanium nitride coating film, the titanium nitride-stripping liquid of the present invention is brought into contact with the titanium nitride coating film, the titanium nitride coating film following serving as an etching mask is dissolved and stripped.

The process for bringing the titanium nitride coating film into contact with the titanium nitride-stripping liquid is not particularly limited, and commonly used process can be employed. Specifically, a process for bringing the titanium nitride coating film with the titanium nitride-stripping liquid using, for example, an immersion method, a paddle method, a shower method or the like may be exemplified. The titanium nitride-stripping liquid of the present invention can be used after heating if necessary. Heating can improve the strippability of the titanium nitride coating film. The temperature upon the contact is preferably from ordinary temperature to 60° C.

Layer that Includes Tungsten or Tungsten Alloy

The material for use in the layer that includes tungsten or a tungsten alloy is not particularly limited as long as it is a metal material that includes tungsten or a tungsten alloy. As the layer that includes tungsten or a tungsten alloy, a conductor layer in semiconductor multilayer laminates can be exemplified.

Insulating Layer

The insulating layer may be, for example, a layer which is generally used in a semiconductor multilayer laminate and is constituted with $SiO_2$, low-k material, or the like.

Second Embodiment

The second embodiment of the present invention is described below. With respect to the second embodiment described in the following, the matters identical with those in the first embodiment may be omitted.

Titanium Nitride-Stripping Liquid

The titanium nitride-stripping liquid of the present invention includes hydrofluoric acid, hydrogen peroxide, a water-soluble organic solvent, and an anticorrosive. Furthermore, the titanium nitride-stripping liquid of the present invention may include an inorganic acid if necessary. The titanium nitride-stripping liquid can be particularly suitably used when a titanium nitride coating film is stripped in a semiconductor multilayer laminate having the titanium nitride coating film, a conductor layer, and an insulating layer.

Anticorrosive

The titanium nitride-stripping liquid of the present invention further contains an anticorrosive that includes a nitrogen-containing five-membered ring compound having two nitrogen atoms in the ring. The nitrogen-containing five-membered ring compound can effectively inhibit the corrosion of particularly a layer that includes tungsten, a tungsten alloy or the like by the titanium nitride-stripping liquid.

Water-Soluble Organic Solvent

The titanium nitride-stripping liquid of the present invention includes a water-soluble organic solvent. The water-soluble organic solvent allows the nitrogen-containing five-membered ring compound to be sufficiently dissolved in the titanium nitride-stripping liquid. This water-soluble organic solvent is not particularly limited, and for example, alcohols, and glycol ethers may be exemplified.

The water-soluble organic solvent which can be used in the titanium nitride-stripping liquid is preferably a glycol ether. The glycol ether can inhibit the corrosion of the insulating layer by the titanium nitride-stripping liquid. Although the glycol ether is not particularly limited, for example, the glycol ether represented by the following general formula (1) may be exemplified.

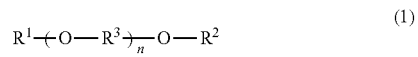
(1)

in the general formula (1), $R^1$ and $R^2$, each independently represent a hydrogen atom, or an alkyl group having 1 to 5 carbon atoms; $R^3$ represents a linear or branched alkylene chain having 1 to 4 carbon atoms; and n is an integer of 1 to 6.

Herein, $R^1$ and $R^2$ each independently represent preferably an alkyl group having 1 to 5 carbon atoms, and more preferably an alkyl group having 1 to 3 carbon atoms. When $R^1$ and $R^2$ are both an alkyl group, the insulating layer can be more effectively inhibited from the corrosion by the titanium nitride-stripping liquid.

Additionally, in light of capability of keeping a high water solubility of the glycol ether, $R^3$ is preferably an ethylene chain or a propylene chain.

Inorganic Acid

The titanium nitride-stripping liquid of the present invention may further include an inorganic acid. In a semiconductor multilayer laminate provided with particularly a layer that includes tungsten or a tungsten alloy, the corrosion of the layer that includes tungsten or the tungsten alloy can be further reduced by lowering the pH of the titanium nitride-stripping liquid with the inorganic acid.

Although the inorganic acid which can be included in the titanium nitride-stripping liquid is not particularly limited as long as it is an inorganic acid other than hydrofluoric acid, nitric acid, sulfuric acid, and hydrochloric acid may be exemplified. These inorganic acids can be preferably used since they slightly affect various types of materials in the semiconductor multilayer laminates. The inorganic acid is preferably sulfuric acid.

The content of the inorganic acid in the titanium nitride-stripping liquid is preferably no less than 0.1% by mass and no greater than 10% by mass. The content of the inorganic acid being no less than 0.1% by mass can effectively inhibit the corrosion of particularly a layer that includes tungsten, a tungsten alloy or the like by the titanium nitride-stripping liquid. In addition, when the content of the inorganic acid is no greater than 10% by mass, decrease of the solubility of titanium nitride may be avoided. The content is more preferably no less than 0.5% by mass and no greater than 5% by mass.

When the inorganic acid is included in the titanium nitride-stripping liquid of the present invention, it is preferred that 100 ml of the titanium nitride-stripping liquid regulated to have a temperature of 25° C. has a pH of no higher than 3 as measured for 1 min with a pH meter calibrated with standard solutions of pH 4 and pH 7. When the pH of the titanium nitride-stripping liquid is adjusted as described above, the corrosion of particularly a layer that includes tungsten, a tungsten alloy or the like in a semiconductor multilayer laminate can be effectively inhibited.

Third Embodiment

The third embodiment of the present invention is described below. With respect to the third embodiment described in the following, the matters identical with those in the first embodiment may be omitted.

Titanium Nitride-Stripping Liquid

The titanium nitride-stripping liquid of the present invention includes hydrofluoric acid, hydrogen peroxide, and a water-soluble organic solvent. Furthermore, the titanium nitride-stripping liquid of the present invention may include an inorganic acid, and an anticorrosive if necessary. The titanium nitride-stripping liquid can be particularly suitably used in applications of stripping a titanium nitride coating film in semiconductor multilayer laminates having the titanium nitride coating film, a conductor layer and an insulating layer, and in applications of etching a titanium nitride coating film using a resist film as an etching mask in semiconductor multilayer laminates having an insulating film. When the titanium nitride-stripping liquid of the present invention is used in the latter applications, the titanium nitride-stripping liquid may include an inorganic acid, and an anticorrosive is necessary, but there is no need to include these components.

Water-Soluble Organic Solvent

The titanium nitride-stripping liquid of the present invention includes a water-soluble organic solvent that contains a polyhydric alcohol or an alkyl ether thereof. The alkyl ether of the polyhydric alcohol included in the titanium nitride-stripping liquid allows the corrosion of the insulating layer by the titanium nitride-stripping liquid in stripping the titanium nitride coating film to be inhibited.

Although the alkyl ether of the polyhydric alcohol which can be used in the titanium nitride-stripping liquid is not particularly limited, for example, a glycol ether is preferred, and a compound represented by the following general formula (1) is further preferred.

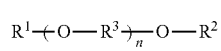
(1)

in the general formula (1), $R^1$ and $R^2$ each independently represent a hydrogen atom, or an alkyl group having 1 to 5 carbon atoms; $R^3$ represents a linear or branched alkylene chain having 1 to 4 carbon atoms; and n is an integer of 1 to 6.

Herein, $R^1$ and $R^2$ each independently represent preferably an alkyl group having 1 to 5 carbon atoms, and more preferably an alkyl group having 1 to 3 carbon atoms. When $R^1$ and $R^2$ are both an alkyl group, the insulating layer can be more effectively inhibited from the corrosion by the titanium nitride-stripping liquid.

Additionally, in light of capability of keeping a high water solubility of the alkyl ether of the polyhydric alcohol, $R^3$ is preferably an ethylene chain or a propylene chain.

Specific examples of the alkyl ether of the polyhydric alcohol which can be included in the titanium nitride-stripping liquid of the present invention include diethylene glycol monomethyl ether, diethylene glycol monoethyl ether, diethylene glycol monobutyl ether, diethylene glycol dimethyl ether, diethylene glycol diethyl ether, diethylene glycol methylethyl ether, triethylene glycol monomethyl ether, tetraethylene glycol monomethyl ether, triethylene glycol dimethyl ether, and tetraethylene glycol dimethyl ether, but not particularly limited thereto. Among these, diethylene glycol monomethyl ether, diethylene glycol monoethyl ether, diethylene glycol dimethyl ether, triethylene glycol dimethyl ether, and tetraethylene glycol dimethyl ether are preferred. These alkyl ethers of the polyhydric alcohols may be used alone, or two or more may be used as a mixture.

Although the polyhydric alcohol which can be used in the titanium nitride-stripping liquid is not particularly limited, for example, the compound represented by the following general formula (2) is preferred.

(2)

in the general formula (2), $R^4$ represents a linear or branched alkylene chain having 1 to 4 carbon atoms which may have a hydroxyl group; and m is an integer of 1 to 6.

In the general formula (2), $R^4$ is preferably an ethylene chain, a propylene chain, or a 2-hydroxypropylene chain.

Specific examples of the polyhydric alcohol which can be used in the titanium nitride-stripping liquid of the present invention include propylene glycol, and glycerin, but not particularly limited thereto. Among these, propylene glycol is preferred. These polyhydric alcohols may be used alone, or two or more may be used as a mixture. Alternatively, an alkyl ether of the polyhydric alcohol and the polyhydric alcohol may be used as a mixture.

The content of the polyhydric alcohol or the alkyl ether thereof in the titanium nitride-stripping liquid of the present invention is preferably no less than 10% by mass and no greater than 90% by mass. When the content of the polyhydric alcohol or the alkyl ether thereof is no less than 10% by mass, the corrosion of the insulating layer by the titanium nitride-stripping liquid can be effectively inhibited. In addition, the content of the polyhydric alcohol or the alkyl ether thereof being no greater than 90% by mass allows high solubility of titanium nitride in the titanium nitride-stripping liquid to be kept. The content is more preferably no less than 50% by mass and no greater than 90% by mass, and particularly preferably no less than 70% by mass and no greater than 85% by mass.

Inorganic Acid

The titanium nitride-stripping liquid of the present invention may further include an inorganic acid. Particularly, in the semiconductor multilayer laminate provided with a layer that includes tungsten or a tungsten alloy, the corrosion of the layer that includes tungsten or the tungsten alloy can be reduced by lowering the pH of the titanium nitride-stripping liquid with the inorganic acid.

The inorganic acid which can be included in the titanium nitride-stripping liquid is not particularly limited as long as it is an inorganic acid other than hydrofluoric acid, and examples thereof include nitric acid, sulfuric acid, hydrochloric acid and the like. These inorganic acids can be preferably used since various types of materials in the semiconductor multilayer laminates are less affected. The inorganic acid is more preferably sulfuric acid.

The content of the inorganic acid in the titanium nitride-stripping liquid is preferably no less than 0.1% by mass and no greater than 10% by mass. When the content of the inorganic acid is no less than 0.1% by mass, the corrosion of particularly a layer that includes tungsten, a tungsten alloy or the like by the titanium nitride-stripping liquid can be effectively inhibited. Also, when the content of the inorganic acid is no greater than 10% by mass, decrease of the solubility of titanium nitride may be avoided. The content is more preferably no less than 0.5% by mass and no greater than 5% by mass.

When the inorganic acid is included in the titanium nitride-stripping liquid of the present invention, it is preferred that 100 ml of the titanium nitride-stripping liquid regulated to have a temperature of 25° C. has a pH of no higher than 3 as measured for 1 min with a pH meter calibrated with standard solutions of pH 4 and pH 7. When the pH of the titanium nitride-stripping liquid is adjusted as described above, the corrosion of particularly a layer that includes tungsten, a tungsten alloy or the like in a semiconductor multilayer laminate by the titanium nitride-stripping liquid can be effectively inhibited.

Method for Stripping Titanium Nitride Coating Film

In the method for stripping a titanium nitride coating film of the present invention, a titanium nitride coating film formed in a semiconductor multilayer laminate having a layer that includes tungsten or a tungsten alloy, and a low-permittivity film as an insulating layer is brought into contact with the titanium nitride-stripping liquid of the present invention, whereby the stripping is executed.

Particularly, the method for stripping a titanium nitride coating film of the present invention can be suitably performed in semiconductor multilayer laminates having a layer that includes tungsten or a tungsten alloy, and a low-permittivity film as an insulating layer, when, after a substrate to be etched is etched using a patterned titanium nitride coating film, the titanium nitride-stripping liquid of the present invention is brought into contact with the titanium nitride coating film, whereby the titanium nitride coating film following serving as an etching mask is dissolved and stripped.

Moreover, in the method for stripping a titanium nitride coating film of the present invention, etching is carried out by bringing a titanium nitride coating film formed in a semiconductor multilayer laminate having a high-permittivity film as an insulating layer, into contact with the titanium nitride-stripping liquid of the present invention via a resist film subjected to pattern formation.

In this case, the method for stripping a titanium nitride coating film of the present invention can be particularly suitably performed when a titanium nitride coating film is etched using a resist film as an etching mask in semiconductor multilayer laminates having a high-permittivity film being an insulating layer.

Insulating Layer

The insulating layer being a low-permittivity film may include, for example, a layer which is generally used in a semiconductor multilayer laminate and is constituted with $SiO_2$, a low-k material, or the like. In addition, the insulating layer being a high-permittivity film refers to, for example, a high-permittivity film commonly used in semiconductor multilayer laminates, and specific examples include $HfO_2$ and HfSiON.

According to the method for stripping a titanium nitride coating film of the present invention, since the titanium nitride-stripping liquid of the present invention is used, a titanium nitride coating film can be stripped in a semiconductor multilayer laminate particularly provided with an insulating layer, in particular, while minimizing the corrosion of the insulating layer.

EXAMPLES

Hereinafter, the present invention will be described in more detail by way of Examples, but the present invention is not limited to the following Examples. In the following Examples, "%" indicates "% by mass" unless otherwise stated in particular.

Example 1

To 17.66 parts by mass of pure water were added 4.29 parts by mass of a 35% aqueous hydrogen peroxide solution, 2.00 parts by mass of 50% hydrofluoric acid, 75.00 parts by mass of diethylene glycol monoethyl ether, and 1.05 parts by mass of 95% sulfuric acid to prepare a titanium nitride solution.

Example 2

To 16.60 parts by mass of pure water were added 4.29 parts by mass of a 35% aqueous hydrogen peroxide solution, 2.00 parts by mass of 35% hydrofluoric acid, 75.00 parts by mass of diethylene glycol monoethyl ether, and 2.10 parts by mass of 95% sulfuric acid to prepare a titanium nitride solution.

Example 3

To 22.10 parts by mass of pure water were added 10.00 parts by mass of a 35% aqueous hydrogen peroxide solution, 1.00 part by mass of 50% hydrofluoric acid, 64.80 parts by mass of diethylene glycol monoethyl ether, and 10.50 parts by mass of 95% sulfuric acid to prepare a titanium nitride solution.

Comparative Example 1

To 95.11 parts by mass of pure water were added 4.29 parts by mass of a 35% aqueous hydrogen peroxide solution, and 0.60 parts by mass of 50% hydrofluoric acid to prepare a titanium nitride solution.

Comparative Example 2

To 18.71 parts by mass of pure water were added 4.29 parts by mass of a 35% aqueous hydrogen peroxide solution, 2.00 parts by mass of 50% hydrofluoric acid, and 75.00 parts by mass of diethylene glycol monoethyl ether to prepare a titanium nitride solution.

Evaluation

Measurement of pH

The pH of each of the titanium nitride-stripping liquids of Examples 1 to 3, and Comparative Examples 1 to 2 regulated to have a temperature of 25° C. in a volume of 100 ml was measured for 1 min with a pH meter "TPX-90Si" (trade name, manufactured by Toko chemical lab. Co. Ltd.) calibrated with standard solutions of pH 4 and pH 7.

The results are shown in Table 1.

Measurement of Etching Rate

The titanium nitride-stripping liquids of Examples 1 to 3, and Comparative Examples 1 and 2 were brought into contact with various kinds of substrates, and the difference in the film thicknesses before and after the contact was determined. The measurement was conducted according to the following method. The value of resistance of a wafer having a titanium nitride coating film formed to have a thickness of 100 nm was measured, and converted with respect to the film thickness of the titanium nitride coating film. The value of resistance of a wafer having a tungsten layer formed to have a thickness of 100 nm was measured, and converted with respect to the film thickness of the tungsten layer. A wafer having a P-TEOS layer formed to have a thickness of 500 nm was measured with an ellipsometer. According to the aforementioned method, the film thicknesses before and after the processing were measured, whereby the etching rate was determined. The determined etching rate of each material, and the etching selectivity for titanium nitride with respect to tungsten, and the etching selectivity for titanium nitride with respect to P-TEOS are shown in Table 1.

TABLE 1

|  | pH | Etching rate (mm/min) TiN | tungsten | Etching selectivity TiN/tungsten |
|---|---|---|---|---|
| Example 1 | 2.24 | 0.38 | 0.05 | 7.6 |
| Example 2 | 1.90 | 0.39 | 0.03 | 13 |
| Example 3 | 0.40 | 0.34 | 0.06 | 5.7 |
| Comparative Example 1 | 3.05 | 0.34 | 0.24 | 1.4 |
| Comparative Example 2 | 3.10 | 0.41 | 0.45 | 0.91 |

As is seen from Table 1, the titanium nitride-stripping liquids of Examples 1 to 3 to which sulfuric acid was added were revealed to exhibit a reduced etching rate of tungsten without lowering of the etching rate of titanium nitride, as compared with the titanium nitride-stripping liquids of Comparative Examples 1 to 2. Thus, the etching selectivity for titanium nitride with respect to tungsten was elevated. Accordingly, it was proven that the titanium nitride coating film could be effectively stripped by using the titanium nitride-stripping liquids of Examples 1 to 3 without affecting tungsten.

Example 4

40.0 parts by mass of a 35% aqueous hydrogen peroxide solution, 0.6 parts by mass of 50% hydrofluoric acid, 58.4 parts by mass of diethylene glycol monomethyl ether, and 1.0 part by mass of 2-ethyl-4-methylimidazole were mixed to prepare a titanium nitride solution.

Example 5

40.0 parts by mass of a 35% aqueous hydrogen peroxide solution, 0.6 parts by mass of 50% hydrofluoric acid, 58.4 parts by mass of diethylene glycol monomethyl ether, and 1.0 part by mass of aminopyrazole were mixed to prepare a titanium nitride solution.

Example 6

40.0 parts by mass of a 35% aqueous hydrogen peroxide solution, 0.6 parts by mass of 50% hydrofluoric acid, 58.4 parts by mass of diethylene glycol monomethyl ether, and 1.0 part by mass of vinylimidazole were mixed to prepare a titanium nitride solution.

Comparative Example 3

40.0 parts by mass of a 35% aqueous hydrogen peroxide solution, 0.6 parts by mass of 50% hydrofluoric acid, 58.4 parts by mass of diethylene glycol monomethyl ether, and 1.0 part by mass of aminotriazole were mixed to prepare a titanium nitride solution.

Comparative Example 4

40.0 parts by mass of a 35% aqueous hydrogen peroxide solution, 0.6 parts by mass of 50% hydrofluoric acid, 58.4 parts by mass of diethylene glycol monomethyl ether, and 1.0 part by mass of benzotriazole were mixed to prepare a titanium nitride solution.

Comparative Example 5

40.0 parts by mass of a 35% aqueous hydrogen peroxide solution, 0.6 parts by mass of 50% hydrofluoric acid, 58.4 parts by mass of diethylene glycol monomethyl ether, and 1.0 part by mass of catechol were mixed to prepare a titanium nitride solution.

Comparative Example 6

40.0 parts by mass of a 35% aqueous hydrogen peroxide solution, 0.6 parts by mass of 50% hydrofluoric acid, 49.4 parts by mass of diethylene glycol monomethyl ether, and 10.0 part by mass of xylitol were mixed to prepare a titanium nitride solution.

Evaluation

Measurement of Etching Rate

The titanium nitride-stripping liquids of Examples 4 to 6, and Comparative Examples 3 to 6 were brought into contact with various kinds of substrates, and the difference in the film thicknesses before and after the contact was determined. The measurement was conducted according to the following method. The value of resistance of a wafer having a titanium nitride coating film formed to have a thickness of 100 nm was measured, and converted with respect to the film thickness of the titanium nitride coating film. The value of resistance of a wafer having a tungsten layer formed to have a thickness of 100 nm was measured, and converted with respect to the film thickness of the tungsten layer. A wafer having a P-TEOS layer formed to have a thickness of 500 nm was measured with an ellipsometer. According to the aforementioned method, the film thicknesses before and after the processing were measured, whereby the etching rate was determined. The determined etching rate of each material, and the etching selectivity for titanium nitride with respect to tungsten, and the etching selectivity for titanium nitride with respect to P-TEOS are shown in Table 2.

TABLE 2

|  | Etching rate (mm/min) TiN | Tungsten | Etching selectivity TiN/tungsten |
|---|---|---|---|
| Example 4 | 0.27 | 0.03 | 9.0 |
| Example 5 | 0.16 | 0.02 | 7.26 |
| Example 6 | 0.12 | 0.01 | 22.6 |
| Comparative Example 3 | 0.03 | 0.34 | 0.08 |
| Comparative Example 4 | 0.01 | 0.12 | 0.07 |
| Comparative Example 5 | 0.52 | 1.12 | 0.46 |
| Comparative Example 6 | 0.24 | 0.17 | 1.41 |

As is seen from Table 2, the titanium nitride-stripping liquids of Examples 4 to 6 including the nitrogen-containing five-membered ring compound having two nitrogen atoms in the ring were revealed to exhibit a reduced etching rate of tungsten without lowering of the etching rate of titanium nitride, as compared with the titanium nitride-stripping liquids of Comparative Examples 3 to 6. Thus, the etching selectivity for titanium nitride with respect to tungsten was elevated. Accordingly, it was proven that the titanium nitride coating film could be effectively stripped by using the titanium nitride-stripping liquids of Examples 4 to 6 without affecting tungsten.

Example 7

40.00 parts by mass of a 31% aqueous hydrogen peroxide solution, 0.50 parts by mass of 50% hydrofluoric acid, 57.95 parts by mass of diethylene glycol monomethyl ether, 0.50 parts by mass of 2-ethyl-4-methylimidazole, and 1.05 parts by mass of 95% sulfuric acid were mixed to prepare a titanium nitride-stripping liquid.

Example 8

40.00 parts by mass of a 31% aqueous hydrogen peroxide solution, 0.50 parts by mass of 50% hydrofluoric acid, 57.95 parts by mass of tetraethylene glycol dimethyl ether, 0.50 parts by mass of 2-ethyl-4-methylimidazole, and 1.05 parts by mass of 95% sulfuric acid were mixed to prepare a titanium nitride-stripping liquid.

Example 9

15.00 parts by mass of a 31% aqueous hydrogen peroxide solution, 0.40 parts by mass of 50% hydrofluoric acid, 80.00 parts by mass of diethylene glycol monoethyl ether, 4.10 parts by mass ion exchanged water, and 0.50 parts by mass of 2-ethyl-4-methylimidazole were mixed to prepare a titanium nitride-stripping liquid.

Comparative Example 7

To 59.50 parts by mass of pure water were added 40.00 parts by mass of a 31% aqueous hydrogen peroxide solution, and 0.50 parts by mass of 50% hydrofluoric acid to prepare a titanium nitride-stripping liquid.
Evaluation
Measurement of Etching Rate The titanium nitride-stripping liquids of Examples 7 to 9, and Comparative Example 7 were brought into contact with various kinds of substrates, and the difference in the film thicknesses before and after the contact was determined. The measurement was conducted according to the following method. The value of resistance of a wafer having a titanium nitride coating film formed to have a thickness of 100 nm was measured, and converted with respect to the film thickness of the titanium nitride coating film. The value of resistance of a wafer having a tungsten layer formed to have a thickness of 100 nm was measured, and converted with respect to the film thickness of the tungsten layer. A wafer having a P-TEOS layer formed to have a thickness of 500 nm was measured with an ellipsometer. According to the aforementioned method, the film thicknesses before and after the processing were measured, whereby the etching rate was determined. The determined etching rate of each material, and the etching selectivity for titanium nitride with respect to tungsten, and the etching selectivity for titanium nitride with respect to P-TEOS are shown in Table 3.

TABLE 3

| | Etching rate (nm/min) | | | Etching selectivity | |
|---|---|---|---|---|---|
| | TiN | tungsten | P-TEOS | TiN/tungsten | TiN/P-TEOS |
| Example 7 | 0.49 | 0.08 | 0.32 | 6.1 | 1.5 |
| Example 8 | 0.50 | 0.08 | 0.21 | 6.3 | 2.4 |
| Example 9 | 0.38 | 0.07 | 0.17 | 5.5 | 2.2 |
| Comparative Example 7 | 0.63 | 1.01 | 5.03 | 0.62 | 0.12 |

As is seen from Table 3, the titanium nitride-stripping liquids of Examples 7 to 9 including the glycol ether were revealed to exhibit a reduced etching rate of tungsten and the insulating film provided by baking P-TEOS without lowering of the etching rate of titanium nitride, as compared with the titanium nitride-stripping liquid of Comparative Example 7. Thus, the etching selectivity for titanium nitride with respect to tungsten and the insulating film provided by baking P-TEOS was elevated. Accordingly, it was proven that the titanium nitride could be effectively stripped by using the titanium nitride-stripping liquids of Examples 7 to 9 without affecting tungsten and the insulating film provided by baking P-TEOS.

Example 10

40.00 parts by mass of a 31% aqueous hydrogen peroxide solution, 0.50 parts by mass of 50% hydrofluoric acid, 58.0 parts by mass of propylene glycol, 0.50 parts by mass of 2-ethyl-4-methylimidazole, and 1.00 part by mass of 95% sulfuric acid were mixed to prepare a titanium nitride-stripping liquid.

Example 11

40.00 parts by mass of a 31% aqueous hydrogen peroxide solution, 0.50 parts by mass of 50% hydrofluoric acid, 58.4 parts by mass of triethylene glycol dimethyl ether, and 1.10 parts by mass of ion exchanged water were mixed to prepare a titanium nitride-stripping liquid.

Comparative Example 8

40.00 parts by mass of a 31% aqueous hydrogen peroxide solution, 0.50 parts by mass of 50% hydrofluoric acid, and 59.5 parts by mass of ion exchanged water were mixed to prepare a titanium nitride-stripping liquid.

Comparative Example 9

40.00 parts by mass of a 31% aqueous hydrogen peroxide solution, 0.50 parts by mass of 50% hydrofluoric acid, 58.1 parts by mass of dimethyl sulfoxide, and 1.40 parts by mass of ion exchanged water were mixed to prepare a titanium nitride-stripping liquid.
Evaluation
Measurement of Etching Rate The titanium nitride-stripping liquids of Examples 10 and 11, and Comparative Examples 8 and 9 were brought into contact with various kinds of substrates, and the difference in the film thicknesses before and after the contact was determined. The measurement was conducted according to the following method. The value of resistance of a wafer having a titanium nitride coating film formed to have a thickness of 100 nm was measured, and converted with respect to the film thickness of the titanium nitride coating film. A wafer having a HfO$_2$ layer formed to have a thickness of 500 nm was measured with an ellipsometer. A wafer having a resist film formed to have a thickness of 300 nm was measured with NanoSpec. According to the aforementioned method, the film thicknesses before and after the processing were measured, whereby the etching rate was determined. The determined etching rate of each material is shown in Table 4.

TABLE 4

| | Etching rate (nm/min) | | |
|---|---|---|---|
| | TiN | HfO$_2$ | Resist |
| Example 10 | 3.30 | 0.20 | <0.1 |
| Example 11 | 14.0 | 0.40 | <0.1 |

TABLE 4-continued

| | Etching rate (nm/min) | | |
|---|---|---|---|
| | TiN | HfO$_2$ | Resist |
| Comparative Example 8 | 4.20 | 0.68 | <0.1 |
| Comparative Example 9 | <0.1 | <0.1 | <0.1 |

As is seen from Table 4, the titanium nitride-stripping liquids of Examples 10 and 11 including the polyhydric alcohol were revealed to exhibit a reduced etching rate of the HfO$_2$ layer and the resist film without lowering of the etching rate of titanium nitride, as compared with the titanium nitride-stripping liquids of Comparative Examples 8 and 9. Accordingly, it was proven that the titanium nitride coating film could be effectively stripped by using the titanium nitride-stripping liquids of Examples 10 and 11 without affecting the insulating film and the resist film.

What is claimed is:

1. A titanium nitride-stripping liquid comprising:
a glycol ether having a content of 70%-85% by mass and of Formula 1:

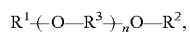

wherein R$^1$ and R$^2$ are each independently an alkyl group having 1-5 carbon atoms, R$^3$ is a straight chain or branched alkylene chain having 1-4 carbon atoms and n is an integer between 1 and 6,
hydrofluoric acid, hydrogen peroxide and water, and further comprising an inorganic acid other than hydrofluoric acid.

2. The titanium nitride-stripping liquid according to claim 1, wherein the inorganic acid is at least one selected from the group consisting of sulfuric acid, nitric acid, and hydrochloric acid.

3. The titanium nitride-stripping liquid according to claim 1, wherein the content of hydrofluoric acid is no less than 0.01% by mass and no greater than 5% by mass, and the content of the inorganic acid is no less than 0.1% by mass and no greater than 10% by mass.

4. The titanium nitride-stripping liquid according to claim 2, wherein the content of hydrofluoric acid is no less than 0.01% by mass and no greater than 5% by mass, and the content of the inorganic acid is no less than 0.1% by mass and no greater than 10% by mass.

5. The titanium nitride-stripping liquid according to claim 1, wherein 100 ml of the titanium nitride-stripping liquid regulated to have a temperature of 25° C. has a pH of no higher than 3 as measured for 1 min with a pH meter calibrated with standard solutions of pH 4 and pH 7.

6. The titanium nitride-stripping liquid according to claim 1, further comprising a nitrogen-containing five-membered ring compound having two nitrogen atoms in the ring.

7. A method for removing a titanium nitride coating film comprising bringing a semiconductor multilayer laminate having a layer that includes tungsten or a tungsten alloy, and a titanium nitride coating film into contact with the titanium nitride-stripping liquid according to claim 1, thereby dissolving to remove the titanium nitride coating film.

8. A titanium nitride-stripping liquid comprising hydrofluoric acid, hydrogen peroxide, a water-soluble organic solvent having a content of 70%-85% by mass, and an anticorrosive, wherein the anticorrosive is a nitrogen-containing five-membered ring compound having two nitrogen atoms in the ring and at least one selected from the group consisting of imidazole, 2-methylimidazole, 1,2-methylimidazole, N-methylimidazole, 4-methylimidazole, 2-ethylimidazole, 2-ethyl-4-methylimidazole, vinylimidazole, 2-undecylimidazole, 2-heptadecylimidazole, 2-phenyl-4-methylimidazole, 1-benzyl-2-methylimidazole, pyrazole, and aminopyrazole.

9. The titanium nitride-stripping liquid according to claim 8, wherein the content of the anticorrosive is no less than 0.1% by mass and no greater than 10% by mass.

10. The titanium nitride-stripping liquid according to claim 8, wherein the water-soluble organic solvent is a glycol ether.

11. The titanium nitride-stripping liquid according to claim 8, further comprising at least one inorganic acid selected from the group consisting of sulfuric acid, nitric acid, and hydrochloric acid.

12. A method for stripping a titanium nitride coating film comprising bringing a semiconductor multilayer laminate having a layer that includes tungsten or a tungsten alloy, and a titanium nitride coating film into contact with the titanium nitride-stripping liquid according to claim 8, thereby stripping to remove the titanium nitride coating film.

13. A titanium nitride-stripping liquid comprising hydrofluoric acid, hydrogen peroxide, and a water-soluble organic solvent, wherein the water-soluble organic solvent consists of a polyhydric alcohol or an alkyl ether thereof, the content of the polyhydric alcohol or the alkyl ether being 70%-85% by mass.

14. The titanium nitride-stripping liquid according to claim 13 wherein the water-soluble organic solvent is at least one selected from the group consisting of diethylene glycol monomethyl ether, diethylene glycol monoethyl ether, diethylene glycol monobutyl ether, diethylene glycol dimethyl ether, diethylene glycol diethyl ether, diethylene glycol methylethyl ether, triethylene glycol monomethyl ether, tetraethylene glycol monomethyl ether, triethylene glycol dimethyl ether, and tetraethylene glycol dimethyl ether.

15. The titanium nitride-stripping liquid according to claim 13, wherein the water-soluble organic solvent is propylene glycol.

16. The titanium nitride-stripping liquid according to claim 13 further comprising at least one inorganic acid selected from the group consisting of sulfuric acid, nitric acid, and hydrochloric acid.

17. The titanium nitride-stripping liquid according to claim 13 further comprising a nitrogen-containing five-membered ring compound having two nitrogen atoms in the ring.

18. The titanium nitride-stripping liquid according to claim 13, wherein the water-soluble organic solvent is represented by the following general formula (1):

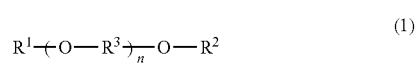

in the general formula (1), R$^1$ and R$^2$ each independently represent a hydrogen atom, or an alkyl group having 1 to 5 carbon atoms; R$^3$ represents a linear or branched alkylene chain having 1 to 4 carbon atoms; and n is an integer of 1 to 6.

19. The titanium nitride-stripping liquid according to claim 18 wherein R$^3$ in the above general formula (1) is an ethylene chain or a propylene chain.

20. The titanium nitride-stripping liquid according to claim 13 wherein the water-soluble organic solvent is represented by the following general formula (2):

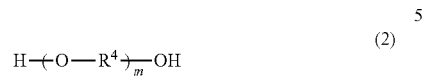

(2)

in the general formula (2), $R^4$ represents a linear or branched alkylene chain having 1 to 4 carbon atoms which may have a hydroxyl group; and m is an integer of 1 to 6.

21. The titanium nitride-stripping liquid according to claim 20 wherein $R^4$ in the above general formula (2) is an ethylene chain, a propylene chain, or a 2-hydroxypropylene chain.

22. A method for stripping a titanium nitride coating film comprising bringing a titanium nitride coating film formed in a semiconductor multilayer laminate having a layer that includes tungsten or a tungsten alloy, and a low-permittivity film into contact with the titanium nitride-stripping liquid according to claim 13.

23. A method for etching a titanium nitride coating film comprising bringing a titanium nitride coating film formed in a semiconductor multilayer laminate having a high-permittivity film into contact with the titanium nitride-stripping liquid according to claim 13 via a resist film subjected to pattern formation.

* * * * *